United States Patent
Aihara

[19]

[11] Patent Number: 5,987,243
[45] Date of Patent: Nov. 16, 1999

[54] HARDWARE AND SOFTWARE CO-SIMULATOR AND ITS METHOD

[75] Inventor: Masami Aihara, Fujisawa, Japan

[73] Assignee: Kabushiki Kaisha Toshiba, Kawasaki, Japan

[21] Appl. No.: 08/919,779

[22] Filed: Aug. 29, 1997

[30] Foreign Application Priority Data

Aug. 30, 1996 [JP] Japan ................................ 8-229621

[51] Int. Cl.[6] .................................................. G06F 17/50
[52] U.S. Cl. .............................. 395/500.38; 395/183.09; 395/704; 395/500.37; 371/27.4
[58] Field of Search .............................. 395/500.38, 500, 395/183.09, 709, 704; 371/27.4; 364/578

[56] References Cited

U.S. PATENT DOCUMENTS

| 4,951,195 | 8/1990 | Fogg, Jr. et al. | 364/200 |
| 5,313,614 | 5/1994 | Goettelmann | 395/500 |
| 5,493,672 | 2/1996 | Lau et al. | 395/500 |

FOREIGN PATENT DOCUMENTS 0772140  7/1997  Belgium .......................... G06F 17/50

OTHER PUBLICATIONS

Passerone, C.; Lavagno, L.; Sansoe, C.; Chiodo, M; Sangiovanni–Vincentelli, A. "Trade–off Evaluation in Embedded System Design via Co–simulation", Proceedings of the ASP–DAC 1997, pp. 291–297, Jan. 1997.

Walker, P.; Ghosh, S. "Exploiting Temporal Independence in Distributed Preemtive Circuit Simulation", Proceedings of the European Design and Test Conference 1997. pp. 378–382, Mar. 1997.

Primary Examiner—Kevin J. Teska
Assistant Examiner—Douglas W. Sergent
Attorney, Agent, or Firm—Foley & Lardner

[57] ABSTRACT

The disclosed hardware and software co-simulator can execute two simulations effectively between two simulators each for executing simulation independently, by eliminating the idle times for waiting the execution end of the opposite simulator. The co-simulator is constructed in such a way that the time data generated at which the events transferred between a fist simulator and a second simulator occur can be extracted by analyzing the simulation data; and the expected occurrence times of the events to be transferred between the simulators are previously indicated to each simulator on the basis of the event occurrence time data.

20 Claims, 5 Drawing Sheets

| | | |
|---|---|---|
| 0×0400 | LD 5000, sp | ~201 |
| 0×0401 | LD [sp], r1 | ~202 |
| 0×0402 | LD [sp+1], r2 | ~203 |
| 0×0403 | CMP r1, r2 | ~204 |
| 0×0404 | BE 0×0408 | ~205 |
| 0×0405 | out 1, r2 | ~206 |
| 0×0406 | INC sp | ~207 |
| 0×0407 | JMP 0×0402 | ~208 |
| 0×0408 | CLR r1 | ~209 |

FIG. 3

| | A | B | C |
|---|---|---|---|
| 100 | 1 | 0 | 0 |
| 520 | 0 | 0 | 1 |
| 892 | 1 | 1 | 1 |
| ⋮ | ⋮ | ⋮ | ⋮ |

HARDWARE AND SOFTWARE CO-SIMULATOR AND ITS METHOD

BACKGROUND OF THE INVENTION

1. Field of the Invention

The present invention relates to a hardware and software co-simulator and a its method, and more specifically to an apparatus for realizing a cooperative simulation which can verify both the functions of hardware and software at the same time, which is required when a logical system constructed by both hardware and software is designed.

2. Description of the Prior Art

Recently, with the advance of the performance of processors, functions so far satisfied by only hardware have been realized by use of software. In order to realize such functions as described above; that is, to construct the such system as described above effectively, it is necessary to design both hardware and software in parallel to each other by considering the tradeoff between both quantitatively.

Therefore, recently, a need of cooperative design of both hardware and software has been increased. In particular, the functional verification for the total system including the consistency between hardware and software is important to improve the design efficiency, so that it is indispensable to provide the hardware and software co-simulator which can simulate both functions of the hardware portion and the software portion simultaneously.

In the conventional hardware and software co-simulator, in general the simulator of a hardware description language (e.g., VHDL or Verilog-HDL) is used as a simulator for the hardware portion, on the other hand, a C program of instruction sets of the processor is used as a simulator for the software portion; and the simulation is executed by operating these two different simulators at the same time. In this case, both the simulators must be operated in synchronism with each other for cooperation with both. This is because the times at which events transferred between both the simulators occur cannot be known previously, before the actual simulations are executed. Therefore, when the actual simulations are executed, if both the simulators are operated without synchronism with each other, it is necessary to bring back the simulator situation to a past time point, so that an overhead inevitably increases.

Therefore, the following methods are so far known as the method of synchronizing the two simulators with each other:

1) A function for managing the entire time is additionally provided for the simulators, and the both simulators execute the simulations in accordance with the commands thereof.

2) One of the simulator is determined as a master and the other thereof is determined as a slave. The simulations are executed in such a way that the slave simulator follows the master simulator, by transferring the mutual simulation time data between both.

In the above-mentioned method 1), although the synchronism can be achieved most simply, since time proceeds in constant time unit as the entire co-simulator, there inevitably exist idle waiting times in both the simulators.

On the other hand, in the method 2), since the two simulators transfer the succeeding simulation time data between both, respectively, although there exists such an advantage that the simulation time can be advance at a time until the time at which at least one of the simulators is operated, there still exists a problem in that when one of the simulators is being operated, an idle waiting time inevitably occurs in the other of the simulators, until one of the simulators ends its operation.

In summary, in the conventional simulator apparatus, when the cooperative simulation is executed between a plurality of simulators, in general, each simulator is operated as an independent process and further the event data are transferred between the two simulators through communications between the processing steps. In this case, since each simulator must always control its own simulation by monitoring the simulation time of the other simulator, it is necessary to synchronize both the simulators with each other. In this case, since the overhead considerably increases, when the cooperative simulations are executed between two simulators having a large speed difference, the high-speed simulator must always wait the low-speed simulator, with the result that the total simulation speed is dependent upon the lowest simulation speed.

As described above, in the conventional simulator apparatus, when a logical system constructed by both hardware and software is required to be designed, in the hardware and software co-simulator used to verify both the functions of the hardware portion and the software portion simultaneously, since the two different simulators used for both the hardware and software portions are operated by synchronizing both the simulation times each other, an idle waiting time is inevitably produced in any one of the simulator according to the progressing situation of the simulators, thus causing a problem in that the simulation times are inevitably lengthened.

SUMMARY OF THE INVENTION

Accordingly, it is the object of the present invention to provide a hardware and software co-simulator, which can execute the cooperative simulation effectively by eliminating the idle waiting time required until the other simulator ends its simulation. In this co-simulator according to the present invention, expected times at which the events are transferred between the two hardware and software portions are previously determined; and the determined times are indicated to the respective simulators to eliminate the idle waiting times.

To achieve the above-mentioned object, the present invention provides a software and hardware co-simulator for simulating operation of each of a plurality of systems, comprising: a plurality of compiling means each provided for each system, for compiling behavior description corresponding to each system to generate at least one of simulating data and machine codes; a plurality of event occur time data extracting means each provided for each system, for extracting event occur time data on the basis of the data generated by said compiling means corresponding to each system; a plurality of expected event occur time informing means each provided for each system, for indicating the expected event occur time depending on the event occur time data extracted by said event occur time data extracting means corresponding to each system, to the other systems; and a plurality of simulating means each provided for each system, for simulating the operation of its own system independently, except the expected event occur times indicated by said expected event occur time informing means corresponding to the systems other than its own system.

Further, the present invention provides a software and hardware co-simulator for verifying functions of both hardware and software portions simultaneously in a logic system composed of hardware and software, comprising: first compiling means for compiling behavior description of the hardware portion, to generate simulating data; first simulating means for executing simulation of the hardware portion on the basis of the simulating data generated by said first compiling means; second compiling means for compiling behavior description of the software portion, to generate machine language codes of a processor; second simulating means for executing the simulation of the software portion on the basis of the machine language codes generated by said second compiling means; first event occur time data extracting means for analyzing the simulating data generated by said first compiling means, to extract the event occur time data applied from said first simulating means to said second simulating means; second event occur time data extracting means for analyzing the machine language codes generated by said second compiling means, to extract the event occur time data applied from said second simulating means to said first simulating means; first expected event occur time informing means additionally provided for said first simulating means, for calculating the expected event occur time on the basis of the event occur time data extracted by said first event occur time data extracting means, to indicate the calculated time to said second simulating means; and second expected event occur time informing means additionally provided for said second simulating means, for calculating the expected event occur time on the basis of the event occur time data extracted by said second event occur time data extracting means, to indicate the calculated time to said first simulating means.

Further, the present invention provides a method of simulating operation of each of a plurality of systems, comprising: a step of compiling behavior description for each system, to generate at least one of simulating data and machine language codes; a step of extracting event occur time data for each system on the basis of the data generated for each system; a step of indicating the expected event occur time depending on the event occur time extracted for each system, to the other systems; and a step of simulating the operation of its own system independently for each system, irrespective of operations of the other systems, except the expected event occur times indicated from the other systems.

DETAILED DESCRIPTION OF THE EMBODIMENTS

Figure 1:
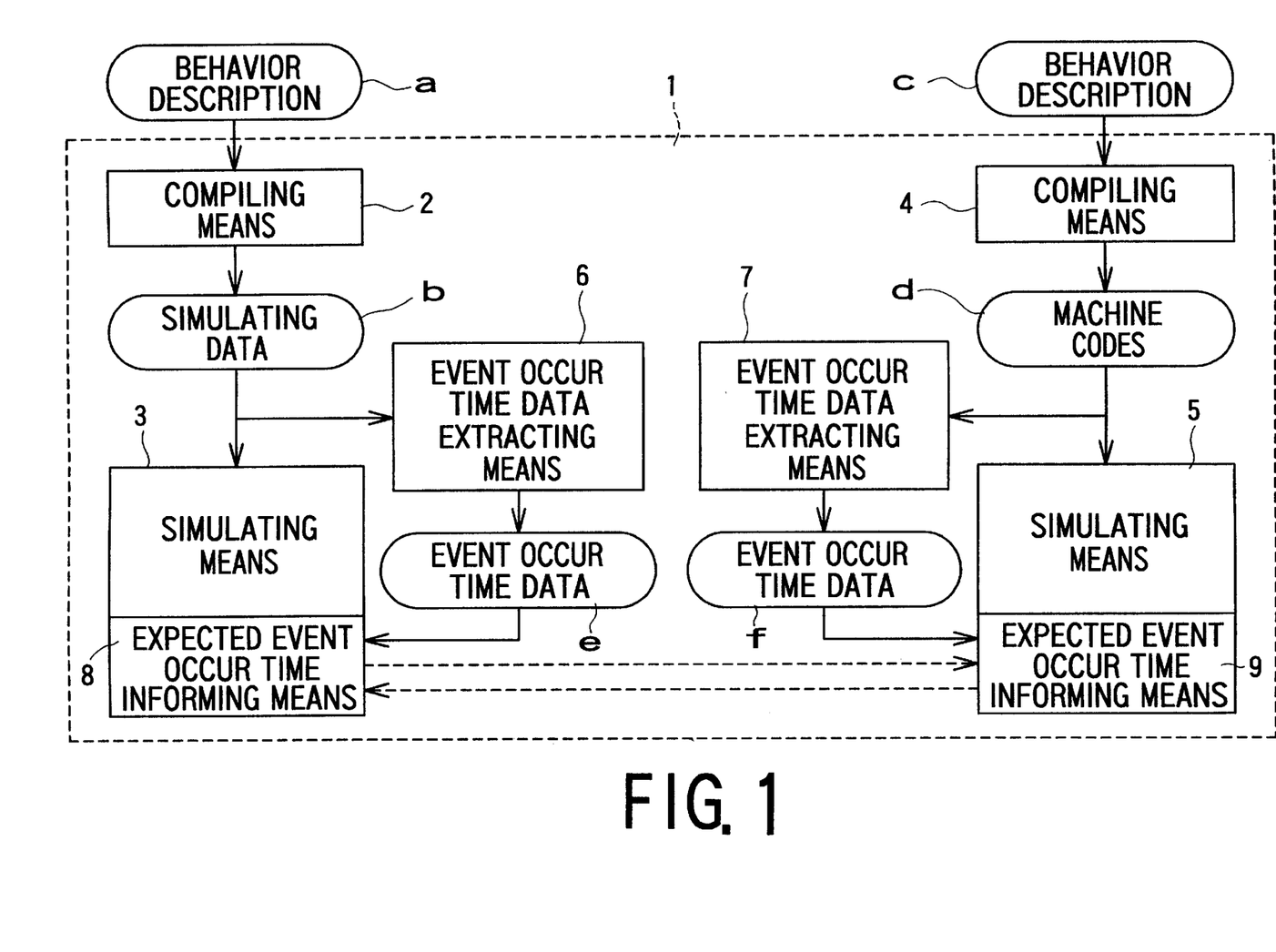
FIG. 1 is a block diagram showing an embodiment of the co-simulator according to the present invention.

An embodiment of the co-simulator according to the present invention will be described hereinbelow with reference to the attached drawings. FIG. 1 is a block diagram showing an embodiment thereof.

In FIG. 1, a co-simulator 1 is composed of a compiling means 2 for compiling the behavior description "a" of a hardware portion of a logical system constructed by hardware and software, to form the simulating data "b"; simulating means 3 for executing the simulation of the hardware portion by using the simulating data "b" formed by the compiling means 2; compiling means 4 for compiling the behavior description "c" of the software portion, to form machine language codes "d" for an objective processor; simulating means 5 for executing the simulation of the software portion by using the machine language codes "d" formed by the compiling means 4; expected event occurrence time extracting means 6 for analyzing the simulating data "b" formed by the compiling means 2, to extract event occurrence time data "e" applied from the simulating means 3 to the simulating means 5; expected event occurrence time extracting means 7 for analyzing the machine language code "d" formed by the compiling means 4, to extract event occurrence time data "f" applied from the simulating means 5 to the simulating means 3; event time informing means 8 attached to the simulating means 3, for calculating expected event occurrence time on the basis of the event occurrence time data "e" extracted by the expected event occurrence time extracting means 6, to inform the simulating means 5 of the calculated event occurrence time; and event time informing means 9 attached to the simulating means 5, for calculating expected event occurrence time on the basis of the event occurrence time data "f" extracted by the expected event occurrence time extracting means 7, to inform the simulating means 3 of the calculated event occurrence time.

Figure 2:
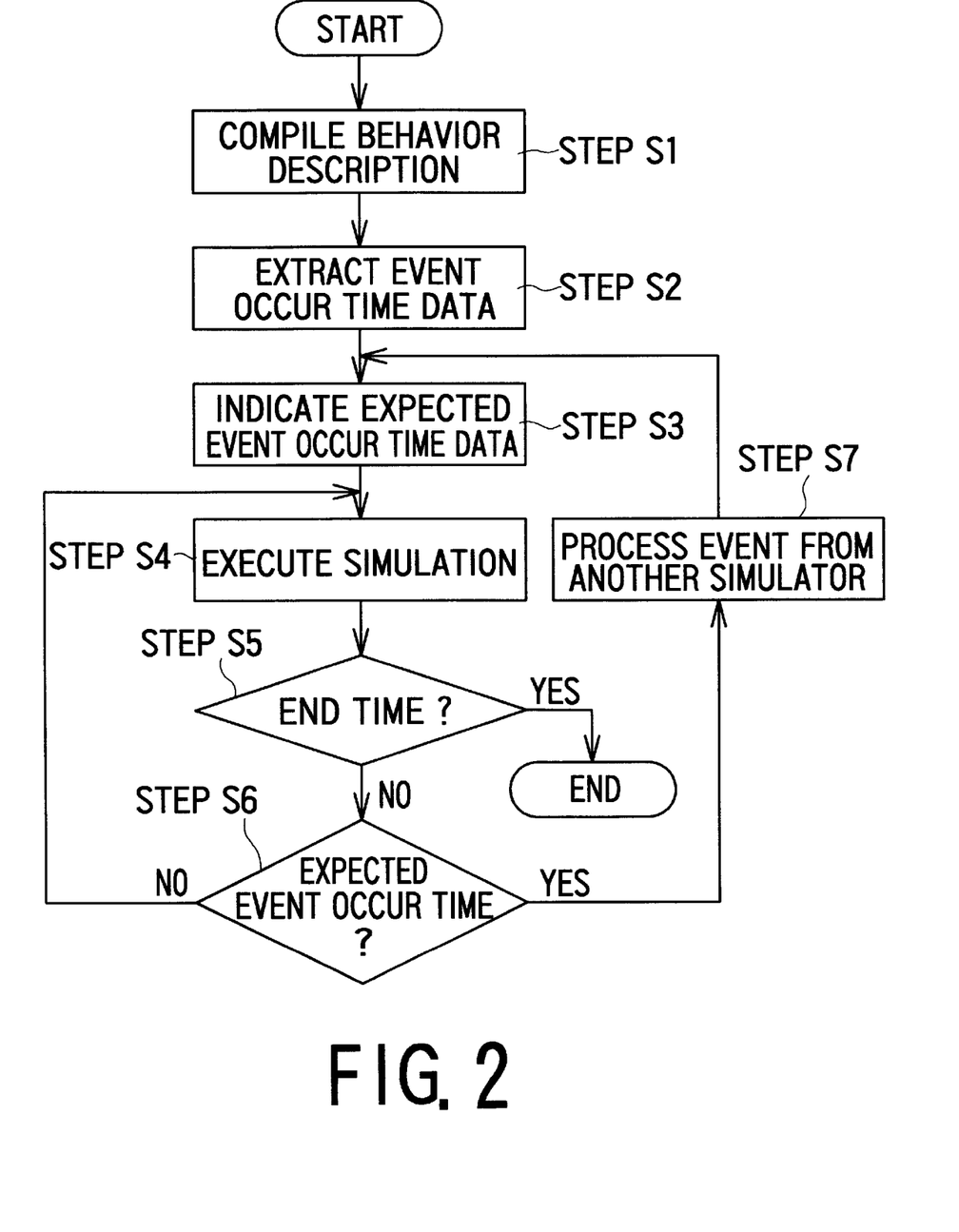
FIG. 2 is a flowchart for assistance in explaining the operation of the co-simulator shown in FIG. 1.

FIG. 2 is a flowchart for assistance in explaining the operation of the co-simulator shown in FIG. 1. The simulating procedure of -he hardware and software co-simulator according to the present invention will be described hereinbelow with reference to FIG. 2.

First, in step S1, the compiling means 2 compiles the behavior description "a" of the hardware portion, and the compiling means 4 compiles the behavior description "c" of the software portion.

Successively, in step S2, the event occurrence time data extracting means 6 and 7 extract the event occurrence time data "e" and "f" transferred between the two simulating means 3 and 5 on the basis of the simulating data "b" and the machine language codes "d" formed by the compiling means 2 and 4, respectively. Further, the method of extracting the event time occurrence times will be described later.

Successively, in step S3, the event occurrence time data extracting means 6 and 7 calculate the expected event occurrence time nearest to the current time point on the basis of the event occurrence time data "e" and "f" extracted in step S2, and further inform the simulating means 3 and 5 of the calculated time, respectively. Further, the method of calculating the expected event occurrence times will be described later.

Successively, in step S4, the simulating means 3 and 5 get the simulating data "b" and the machine language codes "d", and execute the simulation for single time period. At this time, if the expected event occurrence time calculated by the event occurrence time data extracting means 6 and 7 changes, new expected event occurrence time is indicated to the simulating means 3 and 5.

Successively, in step S5, the simulating means 3 and 5 check whether the simulation time reaches the simulation end time, respectively. As a result of the checking, if the simulation time does not reach the end time, in step S6 the simulating means 3 and 5 check whether the simulation time reaches the expected event occurrence time indicated in step S3, respectively. If the time reaches the expected event occurrence time during the operation of step S6, in step S7 the simulating means 3 and 5 wait an event by the other simulating means. If the event is inputted by the other simulating means, the simulating means processes the inputted event. Successively, returning to step S3, the simulating means 3 and 5 continue the succeeding simulations by indicating the new expected event occurrence times.

On the other hand, in step S6, when the time does not reach the expected event occurrence time, the simulating means 3 and 5 return to step S4, to execute the simulations continuously.

As described above, after the hardware and software cooperative simulation has been executed, if the simulation time reaches the simulation end time in the step S5, the processing ends.

Figure 3:
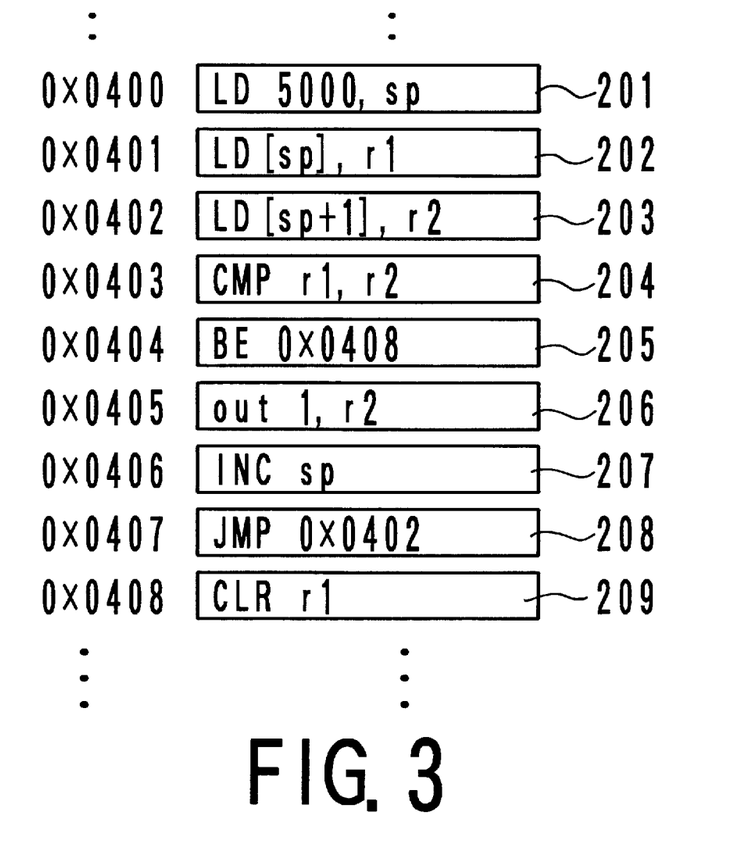
FIG. 3 is an illustration for assistance in explaining the description operation of the software portion, as a part of machine language codes formed by a compiler.

FIG. 3 is an illustration for assistance in explaining an example of the machine language codes "d" formed by compiling the behavior description "c" of the software portion by the compiling means 4, which is shown in the form of a sequence of instructions for the target processors.

In FIG. 3, an instruction 201 denotes a setting of a constant; instructions 204, 207 and 209 denote operations executed by internal registers of the processor; an instruction 205 denotes a branch instruction; an instruction 208 denotes a jump instruction; these instructions are processed only inside the processor; On the other hand, instructions 202 and 203 denote data load from a memory; and an instruction 206 denotes a data output to an output port. In these instructions 202, 203 and 206, events are generated and transmitted to the simulating means 3. Further, as a result of the execution of the instructions 205 and 208, there exists the case where an event is generated at the branch destination.

As described above, it is possible to easily extract the instruction positions at which the events transmitted to the simulating means 3, and further to specify the event occurrence time on the basis of the clock period applied to the processor. Further, in the same way as above, the positions at which the instructions are branched, merged and looped can be extracted easily.

Figure 4:
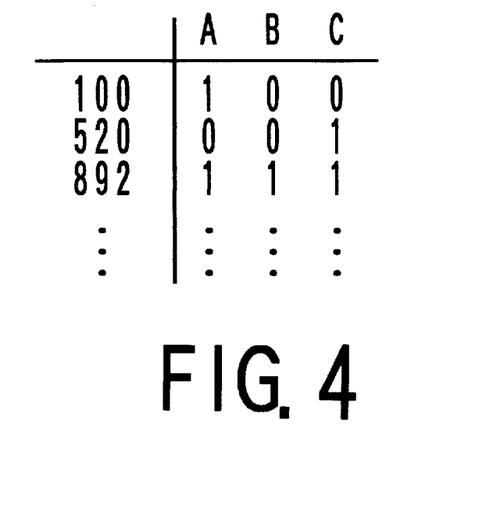
FIG. 4 is an illustration for assistance in explaining the description operation of the hardware portion, as an example of test vectors given during the simulation.

FIG. 4 is an illustration showing an example of the behavior description "a" of the hardware portion given by the simulating means 3 as test vectors; that is, FIG. 4 lists the values of the test vectors (test patterns) and the times at which the test vectors are applied to signals A, B and C, respectively. In more detail, (1, 0, 0), (0, 0, 1) and (1, 1, 1) are applied to the signals A, B and C at times 100 nsec, 520 nsec and 892 nsec, respectively. Further, although the simulations are executed by setting the respective values to the signals A, B and C at the times 100 nsec, 520 nsec and 892 nsec, respectively, if each time is delayed, there exists a possibility that the events applied to the simulating means 5 occurs at each delayed time. However, since the signal changes will not occur at the time other than the above, the simulation is not executed at the time other than the above, so that no event occurs at the time other than the above. Therefore, by analyzing the test vectors, it is possible to extract the designated times as the event occurrence time data "e".

Here, however, when the internal clock is included in the behavior description "a" of the hardware portion, there exists a probability that the simulation is executed on the basis of the internal clock so that events applied to the simulating means 3 occur. With respect to the internal clock, however, it is possible to check whether the internal clock is included in the behavior description "a" by analyzing the simulating data "b" formed by compiling the behavior description "a" of the hardware portion by the compiling means 2. Here, when the internal clock is included therein, since the time at which the clock event occurs can be known by extracting the period data, this known time is extracted as the event occurrence time data "e".

Further, the method of calculating the expected event occurrence time executed in step S3 will be explained hereinbelow.

The event time informing means 8 informs the simulating means 5 of the event occurrence time data "e" extracted by the event occurrence time data extracting means 6 as the expected event occurrence time as it is. Therefore, when the signal is delayed, a time obtained by adding the delay time to the event occurrence time data "e" is indicated as the expected event occurrence time.

On the other hand, the event time informing means 9 calculates the expected event occurrence time by multiplying the relative position data of the instruction extracted by the event occurrence time data extracting means 7 by the clock period and the number of the clocks used for the instruction. Here, it should be noted that the event occurrence time data "f" can be used as it is, only when the machine language code "d" has no conditional branch and no loop.

Further, when there exists a time delay from when the processor indicates the event occurrence to when the event is actually generated by the simulating means 3, the event time informing means 9 indicates the expected event occur time under consideration of this time delay.

Figure 5A:
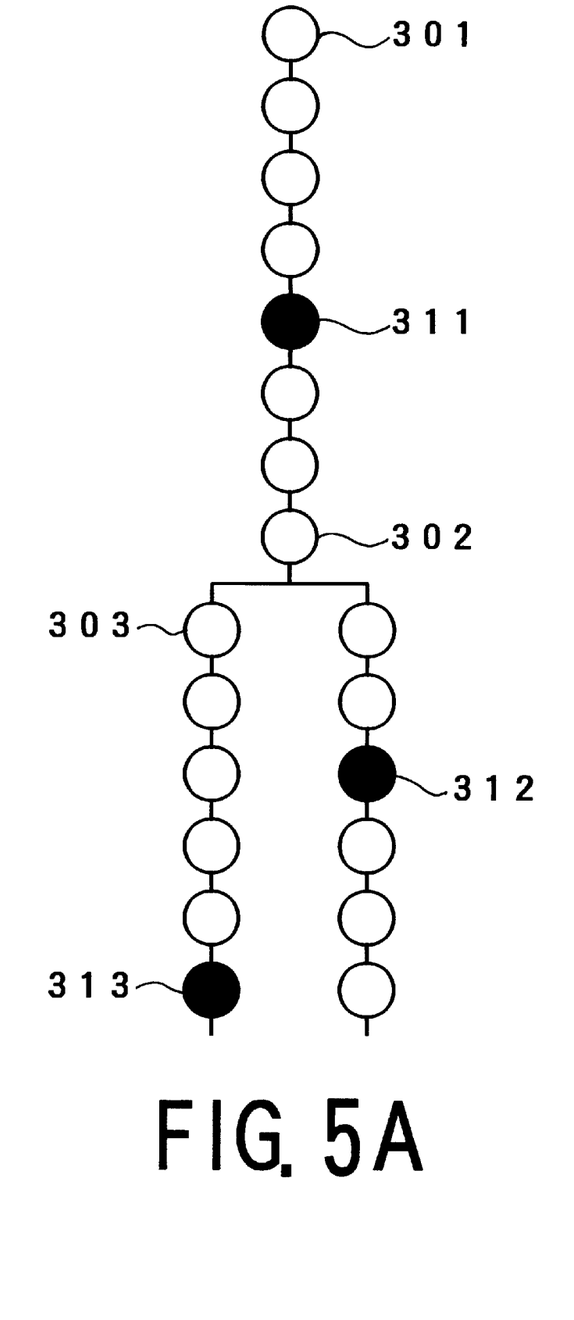
FIG. 5A is an illustration for assistance in explaining the method of calculating the expected event occurrence times, when a branch is included in the machine language codes.
Figure 5B:
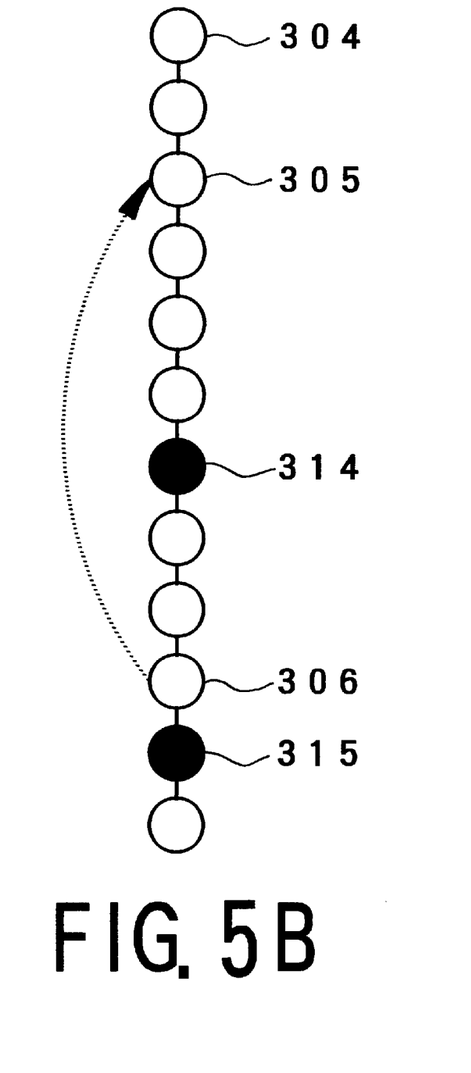
FIG. 5B is an illustration for assistance in explaining the method of calculating the expected event occurrence times, when a loop is included in the machine language codes.

FIG. 5A is an illustrations for assistance in explaining the method of calculating the expected event occurrence time when the machine language codes "d" include a conditional branch, and FIG. 5B is an illustration for assistance in explaining the same method when the machine language codes "d" include a loop. In these drawings, white circles denote the instructions completely processed within the processor, and black circles denote the instructions having a probability that the events applied to the simulating means 3 occur.

When the conditional branch is included as shown in FIG. 5A, at the first time point of the simulation (i.e., at a time point when the instruction 301 is executed), a time at which the instruction 311 is executed is calculated, and the calculated time is indicated from the expected event occurrence time informing means 9 to the simulating means 3 as the expected event occurrence time. Once the instruction 311 is executed, although it is necessary to indicate the succeeding expected event occurrence time, since the instruction 302 is a conditional branch, at this time point, it is impossible to decide which instruction 312 or 313 is to be executed next.

In this case, the time at which the instruction whose relative position is near to the instruction 311 (i.e., the instruction 312) is executed is preliminarily indicated as the expected event occurrence time. Further, at a time point when the instruction 303 is executed, an error of the branch direction is discriminated, and the time at which the instruction 313 is executed is correctly indicated again as the expected event occurrence time. In other words, when there exist a plurality of candidates of the expected event occur times, the position nearest to the current instruction execution position of the processor is always indicated as the expected event occur time. This is because it is difficult to execute the backward simulation.

On the other hand, when a loop is included in the machine language codes "d" as shown in FIG. 5B, at the first simulation time (i.e., the time at which the instruction 304 is executed), the time at which the instruction 314 is executed is first indicated by the expected event occurrence time informing means 9 to the simulating means 3 as the expected event occurrence time. Once the instruction 314 is executed, although it is necessary to indicate the succeeding expected event occurrence time, since the loop is formed in such a way that the instruction is returned from the jump instruction in the instruction 306 to the instruction 305, even if the relative position of the instruction 315 is near the instruction 306, the time at which the instruction 314 is executed is indicated as the expected event occurrence time.

Further, even if the conditional branch and the loop are combined with each other, it is possible to calculate the expected event occurrence time correctly by combining both the above-mentioned methods appropriately.

As described above, both the simulating means 3 and 5 execute each simulation independently, until the event occurs between both, without spending an idle waiting time according to the execution situation of the mutually opposite simulation. As a result, there exists an effect that the simulation times can be shortened.

Figure 6A:
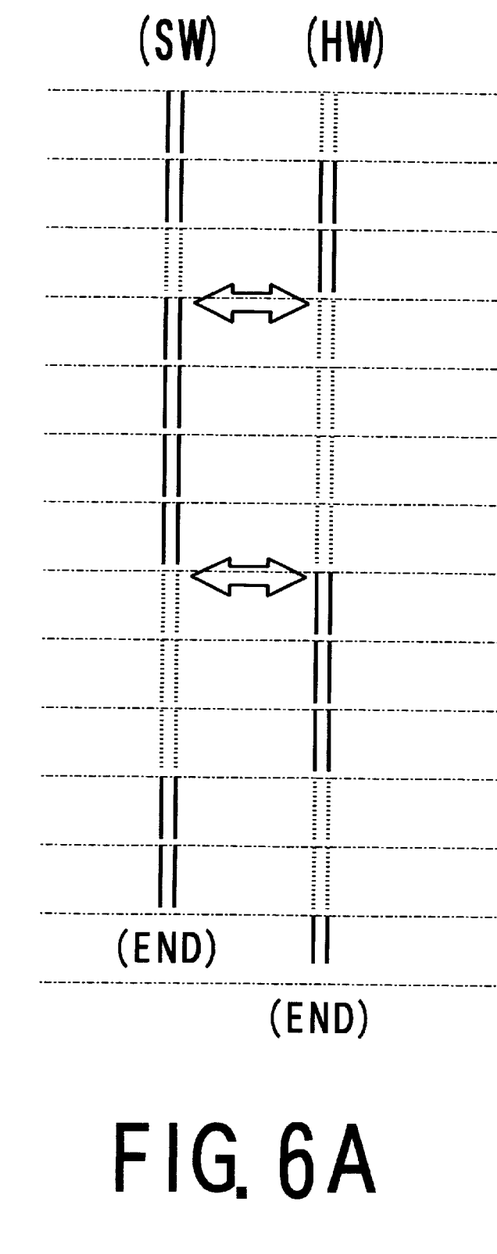
FIG. 6A is an illustration for assistance in explaining the processing time required for the prior art simulator.
Figure 6B:
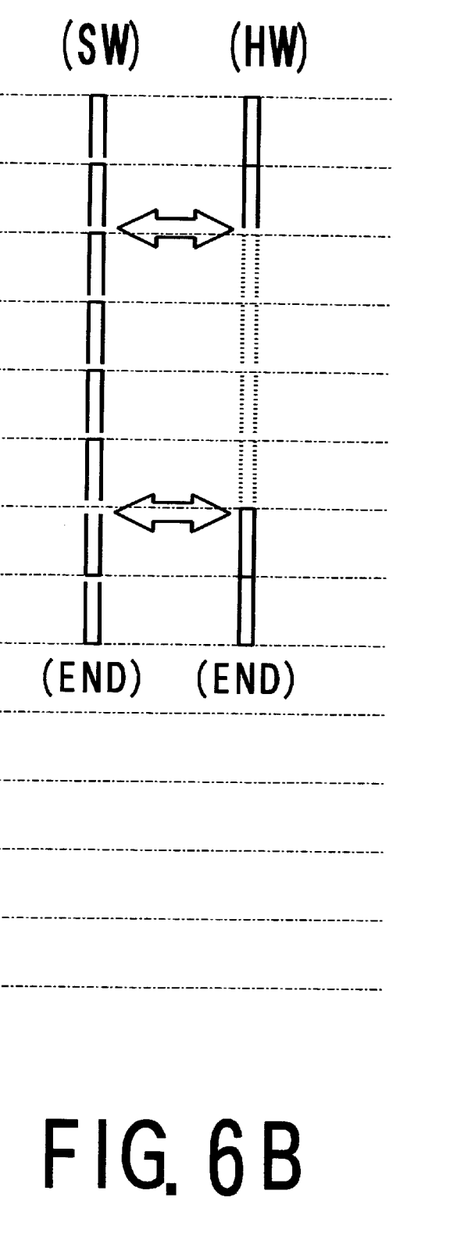
FIG. 6B is an illustration for assistance in explaining the processing time required for the simulator according to the present invention.

FIG. 6 is an illustration used to explain the effect of the present invention, in which 6A denotes the conventional co-simulator and 6B denotes the co-simulator of the present invention. In FIG. 6, time flows from above to below; solid lines indicate the simulation executions of the software SW and hardware HW, respectively; and dashed lines indicate the standby of the software SW and the hardware HW, respectively.

As shown in FIG. 6A, in the conventional method, since each simulation of both the software SW and the hardware HW is executed by waiting an event occurring on the basis of the mutual processing, the standby time for simulation is inevitably produced in both the software SW and the hardware HW, so that an idle waiting time occurs. For instance, in the case of prior art as shown in FIG. 6A, the simulation of the software SW is interrupted in the time period between times T1 and T2 and the time period between the times T3 and T4, until an event occurs by the simulation of the hardware HW.

In contrast with this, in the method according to the present invention as shown in FIG. 6B, as far as events are not transferred between both, since each simulation of both the software SW and the hardware HW is executed separately, without waiting an end of the simulation execution of the mutual opposite simulator, it is possible to shorten the whole simulation time markedly.

Further, in the above-mentioned embodiment, although only the hardware and software co-simulator has been explained by way of example, the gist of the present invention can be of course applied to the inter-hardware co-simulator and inter-software co-simulator.

Further, in the above-mentioned embodiment, although only the co-simulator between the hardware simulator and the software simulator has been described by way of example, the present invention can be applied to the co-simulator comprised of three or more hardware co-simulators or three or more software co-simulators, in the same way.

As described above, in the co-simulator according to the present invention, the simulation data are analyzed previously; the times at which the event occurrences are expected are calculated between a plurality of different simulators; and the expected times are indicated to the other simulator previously. Therefore, when events are not transferred between the simulators, since each simulator can always execute the simulation independently, irrespective of the progress situations of the other simulators, it is possible to eliminate the idle time for waiting the end of the simulation executed by the other simulator, thus providing an actual effect that the hardware and software cooperative simulation can be executed in a short time.

What is claimed is:

1. A software and hardware co-simulator for simulating operation of each of a plurality of systems, comprising:

a plurality of compiling means each provided for each system, for compiling behavior description on each system to generate at least one of simulating data and machine codes;

a plurality of event occur time data extracting means each provided for each system, for extracting event occur time data on the basis of the data generated by said compiling means corresponding to each system;

a plurality of expected event occur time informing means each provided for each system, for indicating the expected event occur time depending on the event occur time data extracted by said event occur time data extracting means corresponding to each system, to the other systems; and a plurality of simulating means each provided for each system, for simulating the operation of its own system independently, except the expected event occur times indicated by said expected event occur time informing means corresponding to the systems other than its own system.

2. The software and hardware co-simulator of claim 1, wherein:

the systems include a single or a plurality of hardware portions and a single or a plurality of software portions;

said compiling means corresponding to the system including the hardware portion generates the simulating data; and said compiling means corresponding to the system including the software portion generates the machine language codes.

3. The software and hardware co-simulator of claim 2, wherein said event occur time data extracting means corresponding to the system including the software portion analyzes instructions of the machine language codes, and classifies the analyzed instructions into those processed only by a processor and those for exerting influence upon elements other than the processor, and extracts relative positions between the instructions for exerting influence upon the elements other than the processor as the event occur time data.

4. The software and hardware co-simulator of claim 3, wherein said event occur time data extracting means extracts the event occur time data under consideration of both of conditional branch instructions and loops included in the machine language codes.

5. The software and hardware co-simulator of claim 4, when the instruction having an event occurrence possibility and the conditional branch instruction are included in the instructions executed by the processor from now on and further when the processor executes the conditional branch instruction prior to the instruction having an event occurrence possibility, said event occur time data extracting means corresponding to the system including the software portion extracts the event occur time data preliminarily on the basis of a relative position to the instruction having an event occurrence possibility and located nearest to the current instruction execution position of the processor, and extracts the final event occur time data according to a branch direction after the processor has executed the conditional branch instruction.

6. The software and hardware co-simulator of claim 4, when the loop is included in the instructions executed by the processor from now on, said event occur time data extracting means corresponding to the system including the software portion extracts the event occur time data on the basis of a relative position to the instruction having an event occurrence possibility and located nearest to the current instruction execution position of the processor along the loop.

7. The software and hardware co-simulator of claim 4, wherein said event occur time data extracting means corresponding to the system including the software portion extracts the event occur time data under consideration of a delay time produced from when the processor indicates the event occurrence to when the event occurs actually.

8. The software and hardware co-simulator of claim 2, wherein said event occur time data extracting means corresponding to the system including the hardware portion analyzes test vectors in addition to the simulating data at the same time, and extract the event occur time data on the basis of time at which the test vectors change.

9. The software and hardware co-simulator of claim 8, wherein when the hardware portion is operating in synchronism with an internal clock, said event occur time data extracting means corresponding to the system including the hardware portion extracts the event occur time data on the basis of period data of the internal clock.

10. The software and hardware co-simulator of claim 8, wherein said event occur time data extracting means corresponding to the system including the hardware portion extracts the event occur time data under consideration of a signal delay produced after the test vectors have been inputted to the hardware.

11. A software and hardware co-simulator for verifying functions of both hardware and software portions simultaneously in a logic system composed of hardware and software, comprising:

first compiling means for compiling behavior description of the hardware portion, to generate simulating data;

first simulating means for executing simulation of the hardware portion on the basis of the simulating data generated by said first compiling means;

second compiling means for compiling behavior description of the software portion, to generate machine language codes of a processor;

second simulating means for executing the simulation of the software portion on the basis of the machine language codes generated by said second compiling means;

first event occur time data extracting means for analyzing the simulating data generated by said first compiling means, to extract the event occur time data applied from said first simulating means to said second simulating means;

second event occur time data extracting means for analyzing the machine language codes generated by said second compiling means, to extract the event occur time data applied from said second simulating means to said first simulating means;

first expected event occur time informing means additionally provided for said first simulating means, for calculating the expected event occur time on the basis of the event occur time data extracted by said first event occur time data extracting means, to indicate the calculated time to said second simulating means; and second expected event occur time informing means additionally provided for said second simulating means, for calculating the expected event occur time on the basis of the event occur time data extracted by said second event occur time data extracting means, to indicate the calculated time to said first simulating means.

12. The software and hardware co-simulator of claim 11, wherein said second event occur time data extracting means analyzes instructions of the machine language codes and further classifies the analyzed instructions into those processed only by a processor and those for exerting influence upon elements other than the processor, and extracts relative positions between the instructions for exerting influence upon the elements other than the processor as the event occur time data.

13. The software and hardware co-simulator of claim 12, wherein said second event occur time data extracting means extracts the event occur time data under consideration of both of conditional branch instructions and loops in addition to the relative positions between the instructions for exerting influence upon the elements other than the processor.

14. The software and hardware co-simulator of claim 13, when the instruction having an event occurrence possibility and the conditional branch instruction are included in the instructions executed by the processor from now on and further when the processor executes the conditional branch instruction prior to the instruction having an event occurrence possibility, said second event occur time data extracting means extracts the event occur time data preliminarily on the basis of a relative position to the instruction having an event occurrence possibility and located nearest to the current instruction execution position of the processor, and extracts the final event occur time data according to a branch direction after the processor has executed the conditional branch instruction.

15. The software and hardware co-simulator of claim 13, when the loop is included in the instructions executed by the processor from now on, said second event occur time data extracting means extracts the event occur time data on the basis of a relative position to the instruction having an event occurrence possibility and located nearest to the current instruction execution position of the processor along the loop.

16. The software and hardware co-simulator of claim 13, wherein said second event occur time data extracting means extracts the event occur time data applied from said second simulating means to said first simulating means under consideration of a delay time produced from when the processor indicates the event occurrence to when the event occurs actually.

17. The software and hardware co-simulator of claim 11, wherein said first event occur time data extracting means analyzes test vectors in addition to the simulating data at the same time, and extracts the event occur time data applied from said first simulating means to said second simulating means on the basis of time at which the test vectors change.

18. The software and hardware co-simulator of claim 11, wherein when the hardware portion is operating in synchronism with an internal clock, said first event occur time data extracting means extracts the event occur time data applied from said first simulating means to said second simulating means on the basis of period data of the internal clock.

19. The software and hardware co-simulator of claim 17, wherein said first event occur time data extracting means extracts the event occur time data applied from said first simulating means to said second simulating means under consideration of a signal delay produced after the test vectors have been inputted to the hardware.

20. A method of simulating operation of each of a plurality of systems, comprising:

a step of compiling behavior description for each system, to generate at least one of simulating data and machine language codes;

a step of extracting event occur time data for each system on the basis of the data generated for each system;

a step of indicating the expected event occur time depending on the event occur time extracted for each system, to the other systems; and a step of simulating the operation of its own system independently for each system, irrespective of operations of the other systems, except the expected event occur times indicated from the other systems.

* * * * *